(12) United States Patent
Cambou

(10) Patent No.: US 8,947,921 B2
(45) Date of Patent: Feb. 3, 2015

(54) MULTILEVEL MAGNETIC ELEMENT

(71) Applicant: Crocus Technology SA, Grenoble Cedex (FR)

(72) Inventor: Bertrand Cambou, Toulouse (FR)

(73) Assignee: Crocus Technology SA, Grenoble (FR)

( * ) Notice: Subject to any disclaimer, the term of this patent is extended or adjusted under 35 U.S.C. 154(b) by 0 days.

(21) Appl. No.: 14/154,405

(22) Filed: Jan. 14, 2014

(65) Prior Publication Data

US 2014/0126283 A1    May 8, 2014

Related U.S. Application Data

(62) Division of application No. 13/281,507, filed on Oct. 26, 2011, now Pat. No. 8,630,112.

(30) Foreign Application Priority Data

Oct. 26, 2010 (EP) ..................................... 10290579

(51) Int. Cl.
  *G11C 11/00* (2006.01)
  *G11C 11/16* (2006.01)
  *G11C 11/56* (2006.01)

(52) U.S. Cl.
  CPC ............ *G11C 11/1675* (2013.01); *G11C 11/16* (2013.01); *G11C 11/5607* (2013.01); *Y10S 977/933* (2013.01); *Y10S 977/935* (2013.01)
  USPC ........... 365/158; 365/148; 365/171; 365/172; 977/933; 977/935

(58) Field of Classification Search
  CPC ...................................................... G11C 11/00
  USPC ......... 365/48, 55, 62, 66, 74, 78, 80–93, 100, 365/130, 131, 148, 158, 171–173, 209, 213, 365/225.5, 230.07, 232, 243.5; 257/295, 257/421, 422, 427, E21.665, E27.006; 438/3; 428/810–816, 817–825.1, 826; 977/933–935
  See application file for complete search history.

(56) References Cited

U.S. PATENT DOCUMENTS

| | | | |
|---|---|---|---|
| 5,640,343 A | 6/1997 | Gallagher et al. | |
| 6,590,335 B1 | 7/2003 | Nagayama | |
| 6,801,451 B2 * | 10/2004 | Tran et al. | 365/158 |
| 6,985,385 B2 * | 1/2006 | Nguyen et al. | 365/173 |
| 2004/0042264 A1 * | 3/2004 | Tran et al. | 365/158 |
| 2004/0065906 A1 * | 4/2004 | Asao | 257/208 |
| 2005/0045913 A1 * | 3/2005 | Nguyen et al. | 257/200 |
| 2011/0007561 A1 | 1/2011 | Berger et al. | |

* cited by examiner

*Primary Examiner* — Harry W Byrne
(74) *Attorney, Agent, or Firm* — Pearne & Gordon LLP

(57) ABSTRACT

The present disclosure concerns a multilevel magnetic element comprising a first tunnel barrier layer between a soft ferromagnetic layer having a magnetization that can be freely aligned and a first hard ferromagnetic layer having a magnetization that is fixed at a first high temperature threshold and freely alignable at a first low temperature threshold. The magnetic element further comprises a second tunnel barrier layer and a second hard ferromagnetic layer having a magnetization that is fixed at a second high temperature threshold and freely alignable at a first low temperature threshold; the soft ferromagnetic layer being comprised between the first and second tunnel barrier layers. The magnetic element disclosed herein allows for writing four distinct levels using only a single current line.

15 Claims, 3 Drawing Sheets

MULTILEVEL MAGNETIC ELEMENT

FIELD

The present invention concerns a magnetic element based on a magnetic tunnel junction and allowing for writing four different state levels and providing extended endurance.

BACKGROUND

The development of magnetic random access memory (MRAM) cells with a magnetic tunnel junction has allowed a significant increase in the performances and operating mode of these MRAMs. Such MRAM cells are described in U.S. Pat. No. 5,640,343. Such MRAM cell typically comprises a magnetic tunnel junction having a tunneling barrier layer between a first ferromagnetic layer and a second ferromagnetic layer. The magnetic tunnel junction is electrically connected at one end to a first current line and, to its other end, to a selection CMOS transistor. The MRAM cell may further comprise a second current line disposed orthogonal to the first current line.

During a write operation of the MRAM cell, the magnetization direction of the first magnetic layer is switched, for example, by applying an external magnetic field. In a thermally assisted (TA) write operation, switching the magnetization direction of the first magnetic layer is performed when the magnetic tunnel junction has been heated to or above a critical temperature. The magnetic tunnel junction is then cooled down below the critical temperature where the first magnetic layer magnetization is "frozen" in the written direction.

During a read operation, the magnetization direction of the second ferromagnetic layer can be compared with the written magnetization direction of the first ferromagnetic layer. This is usually performed by passing a read current through the magnetic tunnel junction such as to measure a resistance of the magnetic tunnel junction. A low measured junction resistance (or level state "0") corresponds to the magnetization direction of the second ferromagnetic layer being oriented parallel to the magnetization direction of the first ferromagnetic layer. A high measured junction resistance (or level state "1") corresponds to the magnetization direction of the second ferromagnetic layer being oriented antiparallel to the magnetization direction of the first ferromagnetic layer. The difference between the value of the high and low junction resistance, or the tunnel magnetoresistance, depends on the material composing the ferromagnetic layers and possibly on heat treatment performed on these ferromagnetic layers.

MRAM cells with a multilevel state write operation has also been proposed, allowing for writing more than the two level states "0" and "1" as described above. Such a MRAM cell with a multilevel state write operation is disclosed in U.S. Pat. No. 6,950,335. Here, the magnetization of the second ferromagnetic layer, or storage layer, can be oriented in any intermediate direction between the direction parallel and the direction antiparallel to the magnetization direction of the first ferromagnetic layer, or reference layer. Orienting the magnetization of the storage layer in the intermediate directions can be achieved by generating magnetic fields with appropriate relative intensity along the perpendicular directions of the first and second current line. However, such multilevel MRAM cells require at least two current lines increasing the complexity of the cell.

BRIEF SUMMARY

The present disclosure concerns a magnetic element can comprise a soft ferromagnetic layer being disposed between a first tunnel barrier layer and a second tunnel barrier layer, a first storage layer, and a second storage layer.

The present disclosure further concerns a multilevel magnetic element comprising a first tunnel barrier layer between a soft ferromagnetic layer with a magnetization that can be freely aligned and a first hard ferromagnetic layer having a fixed magnetization; wherein the magnetic element further comprises a second tunnel barrier layer such that the soft ferromagnetic layer is between the first and second tunnel barrier layer, and a second hard ferromagnetic layer having a fixed magnetization and adjacent to the second tunnel barrier layer.

In an embodiment, the first and second hard ferromagnetic layer can have a magnetization that can be freely aligned at a first predetermined high temperature threshold and at a second predetermined high temperature threshold, respectively, such that, wherein during a write operation said magnetic element is heated at the first predetermined high temperature threshold, and the magnetization of the first storage layer is aligned in a first direction; and said magnetic element is cooled at the second predetermined high temperature threshold, and the magnetization of second storage layer is aligned in a second direction, such that up to four different state levels can be written in the magnetic element.

In another embodiment, the first high temperature threshold of the first antiferromagnetic layer can be substantially equal to the second high temperature threshold of the second antiferromagnetic layer.

In yet another embodiment, the first tunnel barrier layers can have a first junction resistance-area product that is substantially equal to a second junction resistance-area product of the second tunnel barrier layers.

In yet another embodiment, the first predetermined high temperature threshold of the first antiferromagnetic layer can be higher than the second predetermined high temperature threshold of the second antiferromagnetic layer.

In yet another embodiment, the first hard ferromagnetic layer and the second hard ferromagnetic layer can have different magnetic moments.

In yet another embodiment, said soft ferromagnetic layer can have a thickness comprised between 1 nm and 10 nm.

The present disclosure also pertains to a method for writing the magnetic element, comprising:

heating said magnetic element at the first predetermined high temperature threshold such as to free the magnetization of the first storage layer;

applying a first write magnetic field such as to align a magnetization of the first storage layer in accordance with the first magnetic field;

cooling said magnetic element while maintaining the first magnetic field to the second predetermined high temperature threshold, such as to freeze the magnetization of the storage layer in its aligned state and free the magnetization of the second storage layer;

applying a second write magnetic field such as to align a magnetization of the second storage layer in accordance with the second magnetic field; and cooling said magnetic element while maintaining the second magnetic field to the first predetermined low temperature threshold, such as to freeze the magnetization of the second storage layer in its aligned state.

In an embodiment, the first write magnetic field can be oriented in a direction opposed to the one of the second write magnetic field, such that the magnetization of the first storage layer is aligned in a direction opposed of the magnetization of the second storage layer.

In another embodiment, the first write magnetic field is oriented in the same direction as the one of the second write magnetic field, such that the magnetization of the first storage layer is aligned in the same direction as the one of the magnetization of the second storage layer.

The present disclosure further concerns a method for reading the magnetic element, comprising:

applying a first read magnetic field such as to align the magnetization of the sense layer in a first aligned direction in accordance with the first read magnetic field;

measuring a first resistance of the magnetic element;

applying a second read magnetic field such as to align the magnetization of the sense layer in a second aligned direction in accordance with the second read magnetic field; and measuring a second resistance of the magnetic element.

In an embodiment, the first hard ferromagnetic layer and the second hard ferromagnetic layer can have different magnetic moments; and the first read magnetic field can be applied with a zero field value.

The magnetic element disclosed herein allows for writing four distinct levels using only a single current line. Moreover, the magnetic element comprising the first and second tunnel barrier layers allows for reducing the heating current required for heating the magnetic element, resulting in an enhanced endurance of the magnetic element.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
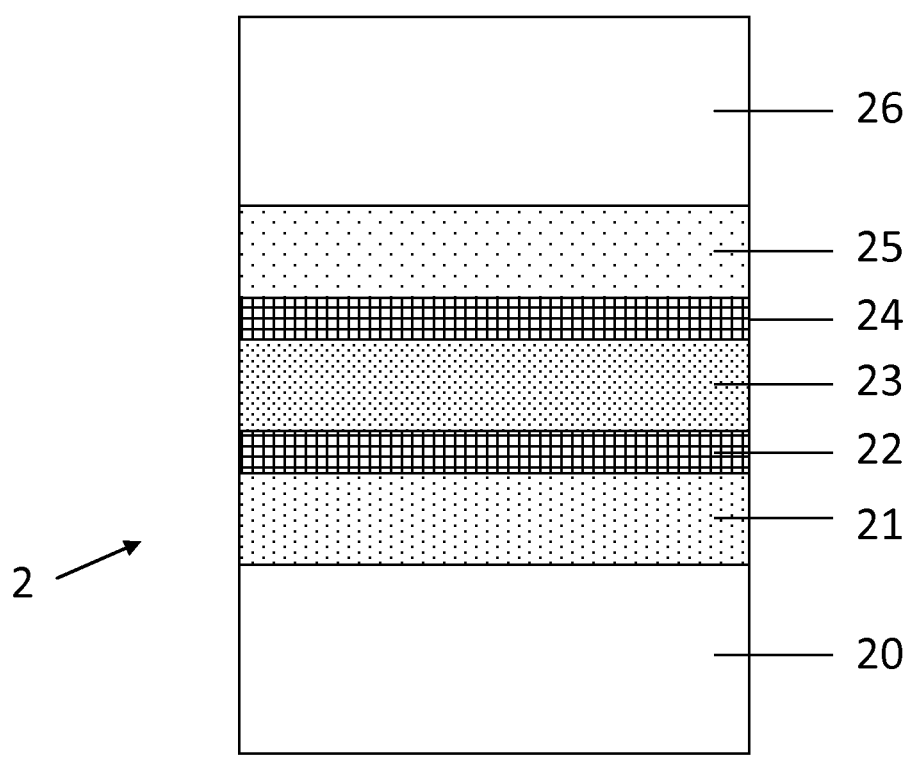
FIG. 1 shows a magnetic element according to an embodiment.

A stack, or a magnetic element 2, is schematically represented in FIG. 1 according to an embodiment. The magnetic element 2 includes a first magnetic tunnel junction portion comprising a first tunnel barrier layer 22 having a first junction resistance-area product $RA_1$, a first hard ferromagnetic layer, or first storage layer 21, and a first antiferromagnetic layer 20. The magnetic element 2 further includes a second magnetic tunnel junction portion comprising a second tunnel barrier layer 24 having a second junction resistance-area product $RA_2$, a second hard ferromagnetic layer, or second storage layer 25, and a second antiferromagnetic layer 26.

The first and second storage layers 21, 25 are typically ferromagnetic layers exchange coupled to the first and second antiferromagnetic layers 20, 26, respectively, such as to provide an exchange anisotropy that enables the storage layers 21, 25 to maintain their magnetization when the antiferromagnetic layers 20, 26, or the magnetic element 2, are at a first predetermined low temperature threshold Tw3, and free their magnetization when the antiferromagnetic layers 20, 26, or the magnetic element 2, are at a first predetermined high temperature threshold Tw1. The magnetic element 2 further comprises a soft ferromagnetic layer, or sense layer 23, having a magnetization that can be freely aligned and disposed between the first and second tunnel barrier layer 22, 24. The arrangement of the magnetic element 2 with the two magnetic tunnel junctions is also called a dual magnetic tunnel junction.

In a first embodiment, the value of the first junction resistance-area product $RA_1$ of the first tunnel barrier layers 22 is substantially the same as the value of the second junction resistance-area product $RA_2$ of the second tunnel barrier layers 24. Moreover, the two magnetic tunnel junction portions have the same tunnel magneto resistance TMR, and the first and second antiferromagnetic layers 20, 26 have the same first predetermined high temperature threshold Tw1. In the present embodiment, the magnetization of the first storage layer 21 is pinned (or fixed) by the first antiferromagnetic layer 20 at the first low temperature threshold Tw3, and is freely alignable at the first high temperature threshold Tw1. The magnetization of the second storage layer 25 is pinned (or fixed) by the second antiferromagnetic layer 26 at the first low temperature threshold Tw3, and can be freely alignable at a second high temperature threshold Tw2, wherein the second high temperature threshold Tw2 is substantially equal to the first high temperature threshold Tw1.

Here, a thermally assisted (TA) write operation can comprise (see FIG. 3):

heating the magnetic element 2 to the first predetermined high temperature threshold Tw1, such as to free the magnetization of the storage layers 21, 25;

applying a first write magnetic field 42 such as to align a magnetization of the first and second storage layers 21, 25 in accordance with the first write magnetic field 42; and cooling the magnetic element 2 while maintaining the first write magnetic field 42 until the magnetic element 2 reaches the first predetermined low temperature threshold Tw3, such as to freeze the magnetization of the storage layers 21, 25 in their aligned state.

Figure 3:
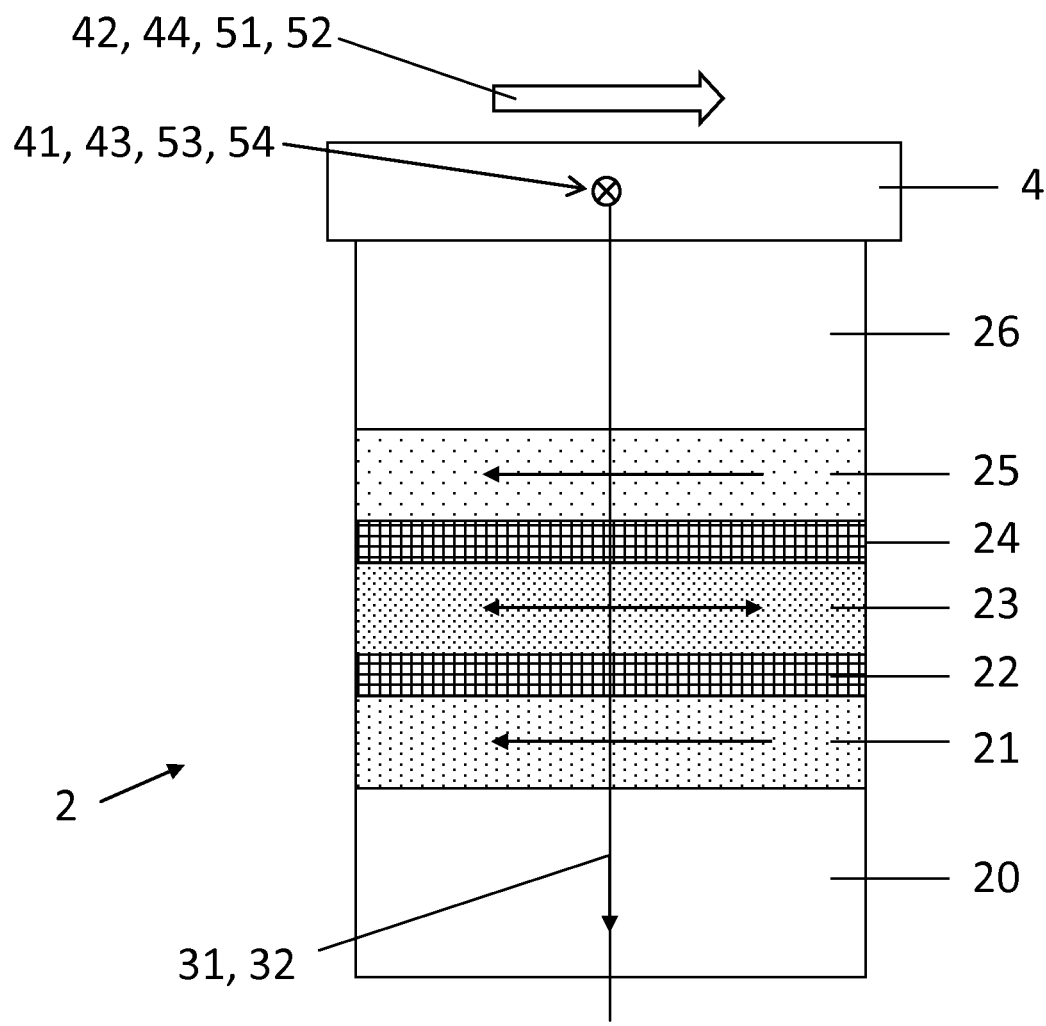
FIG. 3 represents a configuration comprising the magnetic element and a first current line, according to an embodiment.

Heating the magnetic element 2 is typically performed by applying a heating current 31 in a first current line 4, in electrical communication with the magnetic element 2, to the magnetic element 2, possibly via said switching transistor (not shown). Applying the first write magnetic field 42 can be performed by passing a first field current 41 in the first current line 4 as illustrated in FIG. 3. FIG. 3 represents an exemplary configuration comprising the magnetic element 2, and the first current line 4 for passing the heating current 31 and for passing the first write current 41 generating the first write magnetic field 42. Other configurations are also possible. For example, the first write current 41 could be passed in a second current line (not represented).

A read operation can comprise:

applying a first read magnetic field 53 such as to align the magnetization of the sense layer 23 in a first aligned direction in accordance with the first read magnetic field 53;

measuring a first resistance $R_1$ of the magnetic element 2;

applying a second read magnetic field 54 such as to align the magnetization of the sense layer 23 in a second aligned direction in accordance with the second read magnetic field 54;

measuring a second resistance $R_2$ of the magnetic element 2; and determining a difference $\Delta R$ between the first resistance value $R_1$ and the second resistance value $R_2$.

Applying the first and second read magnetic field 53, 54 can be performed by passing, respectively, a first and second read field current 51, 52 in the first current line 4 (see FIG. 3). Alternatively, the first and second read magnetic field 53, 54 can be applied by passing the first and second read field current 51, 52 in the second current line, respectively. Measuring the first and second resistance $R_1$, $R_2$ can be performed by passing a sense current 32 in the first current line 4 to the magnetic element 2. The self-referenced read operation disclosed herein has been disclosed in the not yet published U.S. patent application Ser. No. 12/832,472.

An advantage of the magnetic element 2 according to this embodiment is that the two tunnel barrier layers 22, 24 share the required power to heat the two antiferromagnetic layers 20, 26 to the first predetermined high temperature threshold Tw1. This enable reducing the heating current required for heating the magnetic element 2, or the antiferromagnetic layers 20, 26, at the first predetermined high temperature threshold Tw1, or reducing the corresponding required voltage across each of the first and second tunnel barrier layer 22, 24 by a factor of substantially $\sqrt{2}$ for the same power compared to a conventional stack comprising only one magnetic tunnel junction. Moreover, there is no loss of read margin compared to the conventional one magnetic tunnel junction stack with an additional (non-magnetic) heating element. The placement of the second tunnel barrier layer 24 in the vicinity (very close) to the first tunnel barrier layer 22 ensures that the surface quality of the second tunnel barrier layer 24 be very close to that of the first tunnel barrier layer 22, thereby adding to the overall quality of the magnetic element 2.

In a second embodiment, the first and second tunnel barrier layers 22, 24 have different values of the first and second junction resistance-area product $RA_1$, $RA_2$, and the two magnetic tunnel junctions have possibly different tunnel magneto resistance (TMR) values. Here, the first antiferromagnetic layer 20 has a first predetermined high temperature threshold Tw1 and the second antiferromagnetic layer 26 has a second predetermined high temperature threshold Tw2.

In this configuration, four distinct levels can be written in the magnetic element 2, and sensed using the read operation described above, as outlined in Table 1. Let's assume that the first predetermined high temperature threshold Tw1 of the first antiferromagnetic layer 20 is higher than the second predetermined high temperature threshold Tw2 of the second antiferromagnetic layer 24, such at Tw2, the magnetization of the first storage layer 21 is frozen and the magnetization of the second storage layer 25 can be freely aligned. Then the write operation can comprise:

heating the first antiferromagnetic layer 20 to the first predetermined high temperature threshold Tw1, such as to free the magnetization of the first storage layer 21;

applying the first write magnetic field 42 such as to align a magnetization of the first storage layer 21 in accordance with the first magnetic field 42;

cooling the first antiferromagnetic layer 20 while maintaining the first magnetic field 42 until the layer 20 reach the second predetermined high temperature threshold Tw2, such as to freeze the magnetization of the storage layer 21 in its aligned state and free the magnetization of the second storage layer 25;

applying a second write magnetic field 44 such as to align a magnetization of the second storage layer 25 in accordance with the second magnetic field 44; and cooling the second antiferromagnetic layer 26 while maintaining the second magnetic field until the layer 26 reach the first predetermined low temperature threshold Tw3, such as to freeze the magnetization of the second storage layer 25 in its aligned state.

The first write magnetic field 42 can be oriented in a direction opposed to the one of the second write magnetic field 44 such that the magnetization of the first storage layer 21 is aligned in a direction opposed of the magnetization of the second storage layer 25. In this case, the write operation described above can be used to write four distinct state levels in the magnetic element 2. Applying the second write magnetic field 44 can be performed by passing a second field current 43 in the first current line 4 (FIG. 3) or in the second current line.

Table 1

Figure 2:
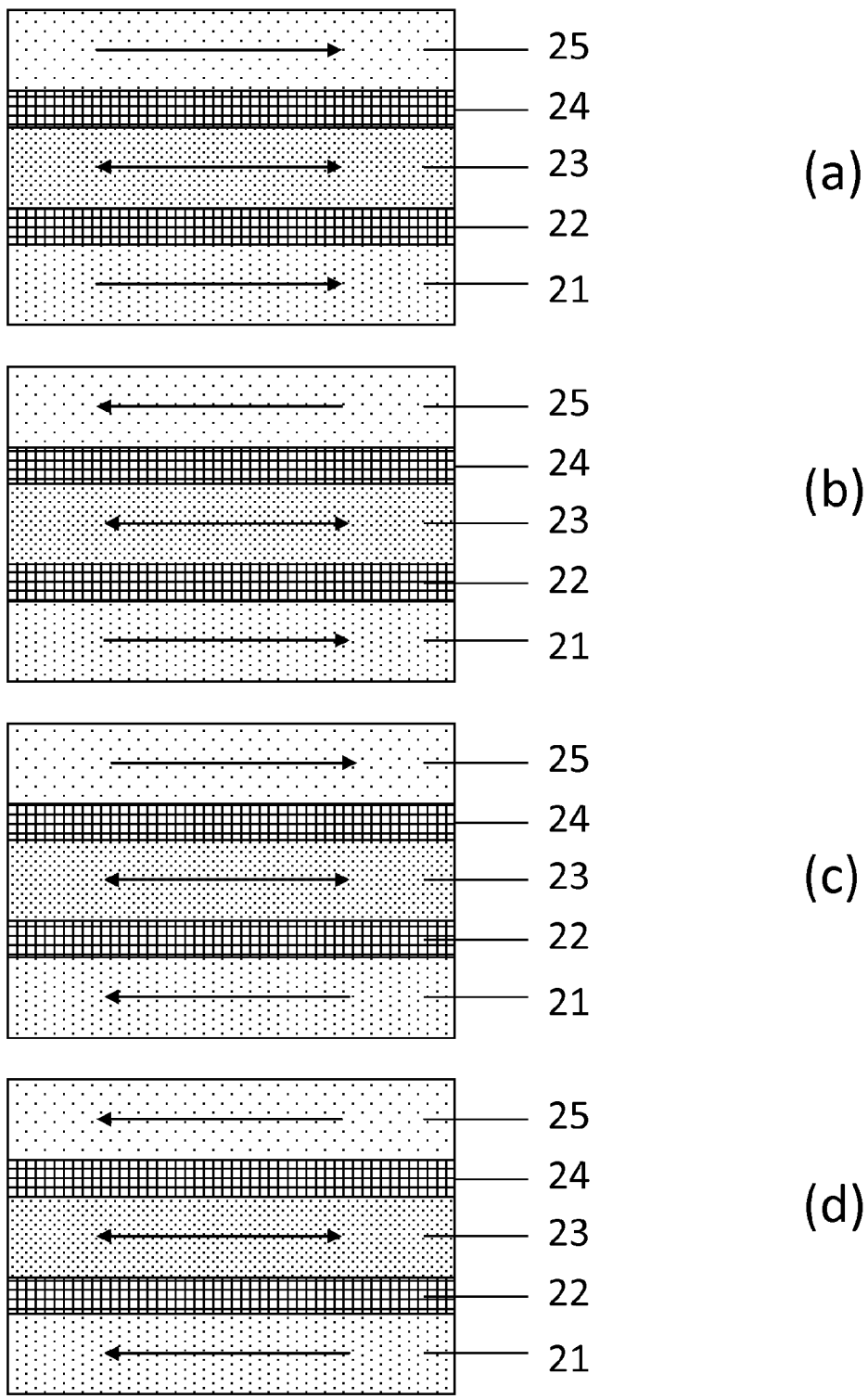
FIG. 2 illustrates a partial view of the magnetic element of FIG. 1 showing the alignment of the magnetization according to an embodiment.

Table 1 summarizes the write operation according to the embodiment where four distinct state levels in the magnetic element 2. In FIG. 2, the corresponding alignment of the magnetization of the storage layers 21, 25 and the sense layer 23 is represented by the arrows. FIG. 2 illustrates a partial view of the magnetic element of FIG. 1 showing the two storage layers 21, 25, the two tunnel barrier layers 22, 24 and the sense layer 23.

More particularly, in a state level "state1" (FIG. 2 (*a*)), the orientation of the first and second write magnetic field is identical and the aligned magnetization direction of the first storage layer 21 is identical to the aligned magnetization direction of the second storage layer 25. During the read operation, the first read magnetic field oriented in the same direction as the aligned magnetization direction of the first and second storage layers 21, 25 yields large measured first and second resistance values ($R_{max1}+R_{max2}$). The second read magnetic field yields small measured first and second resistance values ($R_{min1}+R_{min2}$).

In a state levels "state2" and "state3" (FIGS. 2 (*b*) and (*c*)), the orientation of the first write magnetic field is opposed to

TABLE 1

| | state1 | state2 | state3 | state4 |
|---|---|---|---|---|
| R with ref to left ← | Rmax1 + Rmax2 | Rmax1 + Rmin2 | Rmin1 + Rmax2 | Rmin1 + Rmin2 |
| R with ref to right → | Rmin1 + Rmin2 | Rmin1 + Rmax2 | Rmax1 + Rmin2 | Rmax1 + Rmax2 |
| Write sequence | Heat above Tw1 & Tw2 with H → then cool with H → | Heat above Tw1 & Tw2 with H → and cool to Tw1 > T > Tw2 reverse H ← and complete cooling | Heat above Tw1 & Tw2 with H ← and cool to Tw1 > T > Tw2 reverse H → and complete cooling | Heat above Tw1 & Tw2 with H ← then cool with H ← | the one of the second write magnetic field. In the example of Table 1 and FIG. 2, the magnetization of the first and second storage layers 21, 25 is aligned such that the values of the measured first and second resistance ($R_{max1}+R_{min2}$) and ($R_{min1}+R_{max2}$) for the state level "state2", is distinct than the values of the measured first and second resistance ($R_{min1}+R_{max2}$) and ($R_{max1}+R_{min2}$) for the state level "state3".

In a state level "state4" (FIG. 2 (*d*)), the orientation of the first write magnetic field is opposed is identical but opposed that the one used in state level "state1", and the magnetization of the first and second storage layers 21, 25 is aligned such that the values of the measured first and second resistance ($R_{min1}+R_{min2}$) when applying the first read magnetic field are small, and the values of the measured first and second resistance ($R_{max1}+R_{max2}$) when applying the first read magnetic field are large.

These four state levels allow for the coding of two bits per cell (or per magnetic element 2) with the use of the single current line. Moreover, the magnetic element 2 has an enhanced endurance due to the dual magnetic tunnel junction arrangement as described above.

In an embodiment, the first antiferromagnetic layer 20 can be made from IrMn, the first storage layer 21 can be made from NiFe/CoFeB, the first tunnel barrier layer 22 can be made from MgO with a first junction resistance-area product ($RA_1$) of about 20, and the sense layer 23 can be made from CoFeB. The sense layer 23 can have a thickness comprised between 1 nm and 10 nm. The second tunnel barrier layer 24 can be made from MgO with a first junction resistance-area product ($RA_2$) of about 40, and the second storage layer 25 can be made from NiFe/CoFeB, and the second antiferromagnetic layer 26 from FeMn. Using MgO for forming the tunnel barrier layers 22, 24 with MgO can advantageous produce extremely flat tunnel barrier layers 22, 24. This is a desirable quality for high performance magnetic tunnel junctions used in TAS-MRAM applications.

Table 2 reports the resistance level values determined in the case of the magnetic element 2 having a diameter of about 0.15 μm and with the layers 20, 21, 22, 23, 24, 25, 26 having the composition described above.

TABLE 2

| State level | first resistance, magnetization of sense layer pointed left | second resistance, magnetization of sense layer pointed right | Difference between first and second resistances |
| --- | --- | --- | --- |
| State 1 | 7922 | 3395 | 4527 |
| State 2 | 5093 | 6791 | −1698 |
| State 3 | 6791 | 5093 | 1698 |
| State 4 | 3395 | 7922 | −4527 |

Many alternative embodiments are possible including the use of a partially compensated SAF reference/sense layer (layer between the two tunnel barriers 22, 24).

In another embodiment, the two ferromagnetic storage layers 21, 25 have different magnetic moments. This results in a well defined orientation for the sense layer 23 in the absence of the write magnetic field 42, 44.

Here, the read operation can comprise measuring the first resistance $R_1$ of the magnetic element 2 without applying the first read magnetic field 53 (or applying the first read magnetic field 53 with a zero field value), followed by measuring the second resistance $R_2$ of the magnetic element 2 when applying the second read magnetic field 54 having a single magnetic field direction.

The four state levels can be determined by measuring the initial resistance value and the change in resistance, as represented in Table 3. This allows for reducing the read operation time and power consumption for performing the read operation. Table 3 describe the read and write sequence according to this embodiment.

TABLE 3

|  | state1 | state2 | state3 | state4 |
| --- | --- | --- | --- | --- |
| R in H = 0 | Rmax1 + Rmax2 | Rmin1 + Rmax2 | Rmin1 + Rmax2 | Rmax1 + Rmax2 |
| R with ref to right → | Rmin1 + Rmin2 | Rmin1 + Rmax2 | Rmax1 + Rmin2 | Rmax1 + Rmax2 |
| Write sequence | Heat above Tw1 & Tw2 with H → then cool with H → | Heat above Tw1 & Tw2 with H → and cool to Tw1 > T > Tw2 reverse H ← and complete cooling | Heat above Tw1 & Tw2 with H ← and cool to Tw1 > T > Tw2 reverse H → and complete cooling | Heat above Tw1 & Tw2 with H ← then cool with H ← |

Table 4 reports the resistance level values for the stack having a diameter of about 0.15 μm, and the different layers having the compositions as described above.

In another embodiment, the read operation can comprise measuring a resistance of the magnetic element 2 when applying a read magnetic field having a single magnetic field direction, followed by measuring a resistance of the magnetic element 2 without applying the read magnetic field.

TABLE 4

| State level | first resistance, no magnetic field applied (H = 0) | second resistance, magnetic field applied | Difference between first and second resistances |
| --- | --- | --- | --- |
| State 1 | 7922 | 3395 | 4527 |
| State 2 | 6791 | 6791 | 0 |
| State 3 | 6791 | 5093 | 1698 |
| State 4 | 7922 | 7922 | 0 |

The configuration of the magnetic element 2 according to the embodiments is advantageous compared to conventional TAS MRAM stacks. Indeed, the dual magnetic tunnel junction configuration described herein comprising two tunnel barrier layers 22, 24 separated by a thin ferromagnetic sense layer 23, enables the two tunnel barrier layers 22, 24 to be formed with high quality.

The magnetic element 2 with the dual magnetic tunnel junction reduces the voltage drop on each tunnel barrier layer 22, 24 during the write operation (total voltage shared between the two tunnel barrier layers 22, 24). The use of two different antiferromagnetic layers 20, 26, each having a different predetermined high temperature threshold Tw1, Tw2, and each being coupled to the first and second storage layer 21, 25, allows for having up to four different resistance state levels per cell (or magnetic element 2) thus increasing the storage capacity from 1 bit/cell to 2 bits/cell. Note that the magnetic element 2 disclosed herein is distinct from the dual MTJ for TAS-MRAM described in publication J. App. Phys. 99 08N901 (2006).

REFERENCE NUMBERS AND SYMBOLS 2 magnetic element, stack
20 first antiferromagnetic layer
21 first storage layer
22 first tunnel barrier layer
23 reference or sense layer
24 second tunnel barrier
25 second storage layer 26 second antiferromagnetic layer
31 heating current
32 sense current
4 first current line
41 first field current
42 first write magnetic field
43 second write magnetic field
44 second write magnetic field
51 first read field current
52 second read field current
53 first read magnetic field
54 second read magnetic field
$RA_1$ first junction resistance-area product
$RA_2$ second junction resistance-area product
$R_1$ first resistance
$R_2$ second resistance
ΔR difference between the first and second resistances
TMR tunnel magneto resistance
Tw1 first high temperature threshold
Tw2 second high temperature threshold
Tw3 first low temperature threshold

The invention claimed is:

1. A method for operating a magnetic element, the magnetic element comprising: a soft ferromagnetic layer having a magnetization that can be freely aligned; a first hard ferromagnetic layer having a magnetization that is fixed at a first low temperature threshold and freely alignable at a first high temperature threshold; a first tunnel barrier layer between the soft ferromagnetic layer and the first hard ferromagnetic layer; a second hard ferromagnetic layer having a magnetization that is fixed at the first low temperature threshold and freely alignable at a second high temperature threshold; and a second tunnel barrier layer; the soft ferromagnetic layer being comprised between the first and second tunnel barrier layers; the method comprising, during a write operation:
heating said magnetic element to the first high temperature threshold;
applying a first write magnetic field such as to align the magnetization of the first storage layer and the magnetization of the second storage layer in accordance with the first magnetic field;
cooling said magnetic element to the first low temperature threshold such as to freeze the magnetization of the first and second storage layers in their aligned state.

2. Method according to claim 1, wherein
the first predetermined high temperature threshold is higher than the second predetermined high temperature threshold; the method further comprising:
cooling said magnetic element to the second high temperature threshold; and
applying a second write magnetic field such as to align the magnetization of the second storage layer in accordance with the second magnetic field; such that up to four distinct state levels can be written in the magnetic element.

3. Method according to claim 2, wherein
the first write magnetic field is oriented in a direction opposed to the one of the second write magnetic field, such that the magnetization of the first storage layer is aligned in a direction opposed of the magnetization of the second storage layer.

4. Method according to claim 2, wherein
the first write magnetic field is oriented in the same direction as the one of the second write magnetic field, such that the magnetization of the first storage layer is aligned in the same direction as the one of the magnetization of the second storage layer.

5. Method according to claim 1, further comprising, during a read operation
applying a first read magnetic field such as to align the magnetization of the sense layer in a first aligned direction in accordance with the first read magnetic field;
measuring a first resistance of the magnetic element;
applying a second read magnetic field such as to align the magnetization of the sense layer in a second aligned direction in accordance with the second read magnetic field; and
measuring a second resistance of the magnetic element.

6. Method according to claim 5, wherein
the first hard ferromagnetic layer and the second hard ferromagnetic layer have different magnetic moments; and wherein
the first read magnetic field is applied with a zero field value.

7. A method for operating a multilevel magnetic element, the magnetic element comprising a soft ferromagnetic layer having a magnetization that can be freely aligned; a first hard ferromagnetic layer having a magnetization that is fixed at a first low temperature threshold and freely alignable at a first high temperature threshold; a first tunnel barrier layer between the soft ferromagnetic layer and the first hard ferromagnetic layer; a second hard ferromagnetic layer having a magnetization that is fixed at the first low temperature threshold and freely alignable at a second high temperature threshold, lower than the first predetermined high temperature threshold; and a second tunnel barrier layer; the soft ferromagnetic layer being comprised between the first and second tunnel barrier layers;
the method comprising, during a write operation:
heating said magnetic element to the first high temperature threshold such as to free the magnetization of the first and second storage layers;
applying a first write magnetic field such as to align the magnetization of the first storage layer in accordance with the first magnetic field;
cooling said magnetic element to the second high temperature threshold such as to freeze the magnetization of the first storage layer and free the magnetization of the second storage layer; and
applying a second write magnetic field such as to align the magnetization of the second storage layer in accordance with the second magnetic field.

8. Method according to claim 7,
further comprising cooling said magnetic element to the first low temperature threshold such as to freeze the magnetization of the second storage layer in its aligned state.

9. Method according to claim 7,
wherein said cooling said magnetic element to the second high temperature threshold is performed while maintaining the first magnetic field until the first antiferromagnetic layer reaches the second predetermined high temperature threshold.

10. Method according to claim 8,
wherein said cooling said magnetic element to the first low temperature threshold is performed while maintaining the second magnetic field until the second antiferromagnetic layer reaches the first predetermined low temperature threshold.

11. Method according to claim 7,
wherein the first antiferromagnetic layer is made of IrMn and the second antiferromagnetic layer is made of FeMn.

12. Method according to claim 11,
wherein each of the first and second storage layer is made of NiFe/CoFeB and the sense layer is made of CoFeB.

13. Method according to claim 11,
wherein each of the first and second tunnel barrier layer is made of MgO.

14. Method according to claim 7,
wherein the first write magnetic field is oriented in a direction opposed to the one of the second write magnetic field, such that the magnetization of the first storage layer is aligned in a direction opposed of the one of second storage layer magnetization.

15. Method according to claim 7,
wherein the first write magnetic field is oriented in the same direction as the one of the second write magnetic field, such that the magnetization of the first storage layer is aligned in the same direction as the one of the second storage layer magnetization.

\* \* \* \* \*